US012641753B2

(12) United States Patent
Ding et al.

(10) Patent No.: US 12,641,753 B2
(45) Date of Patent: May 26, 2026

(54) WATER-COOLED HEAT DISSIPATION MODULE, ELECTRONIC DEVICE AND CONTROL METHOD THEREOF

(71) Applicant: Lenovo (Beijing) Limited, Beijing (CN)

(72) Inventors: Bo Ding, Beijing (CN); Bai Lin, Beijing (CN)

(73) Assignee: LENOVO (BEIJING) LIMITED, Beijing (CN)

( * ) Notice: Subject to any disclaimer, the term of this patent is extended or adjusted under 35 U.S.C. 154(b) by 515 days.

(21) Appl. No.: 18/071,154

(22) Filed: Nov. 29, 2022

(65) Prior Publication Data
US 2023/0171922 A1 Jun. 1, 2023

(30) Foreign Application Priority Data
Nov. 30, 2021 (CN) .......................... 202111443738.1

(51) Int. Cl.
*H05K 7/20* (2006.01)

(52) U.S. Cl.
CPC ..... *H05K 7/20281* (2013.01); *H05K 7/20154* (2013.01); *H05K 7/20172* (2013.01); *H05K 7/20263* (2013.01); *H05K 7/20272* (2013.01)

(58) Field of Classification Search
CPC .......... H05K 7/20135; H05K 7/20145; H05K 7/20154; H05K 7/20172; H05K 7/20254; H05K 7/20263; H05K 7/20272; H05K 7/20218; H05K 7/20282; H05K 7/2029; H05K 7/20309; H05K 7/20318; H05K 7/20327; H05K 7/20336; H05K 7/20354;

H05K 7/2039; H05K 7/20663; H05K 7/20727; H05K 7/20772; H05K 7/208; H05K 7/20936; G06F 1/20; G05B 2219/45006; G05B 2219/49216; G03B 21/16
See application file for complete search history.

(56) References Cited

U.S. PATENT DOCUMENTS

| | | | | |
|---|---|---|---|---|
| 4,720,981 A | * | 1/1988 | Helt ................... | H05K 7/20936 165/80.4 |
| 7,318,322 B2 | * | 1/2008 | Ota .................... | H05K 7/20781 62/305 |
| 7,420,804 B2 | * | 9/2008 | Leija ................. | H05K 7/20772 361/679.48 |
| 8,955,346 B2 | * | 2/2015 | Campbell ............. | F25B 25/005 62/276 |

(Continued)

FOREIGN PATENT DOCUMENTS

CN 111526693 A 8/2020

*Primary Examiner* — Amir A Jalali
(74) *Attorney, Agent, or Firm* — ANOVA LAW GROUP, PLLC

(57) ABSTRACT

A water-cooled heat dissipation module. The water-cooled heat dissipation module includes a first heat dissipation branch for guiding a heat dissipation medium to flow in a first space; a second heat dissipation branch communicating with the first heat dissipation branch for guiding the heat dissipation medium to flow in a second space; and a control assembly for controlling a flow rate of the heat dissipation medium in the first heat dissipation branch and/or the second heat dissipation branch, where the first space and the second space are at least partially non-overlapping.

13 Claims, 7 Drawing Sheets

(56)     References Cited

U.S. PATENT DOCUMENTS

| | | | |
|---|---|---|---|
| 10,512,193 B1 * | 12/2019 | Chen | G06F 1/206 |
| 12,167,578 B2 * | 12/2024 | Isoya | H05K 7/20272 |
| 2003/0010050 A1 * | 1/2003 | Scott | G06F 1/20 257/E23.098 |
| 2004/0008483 A1 * | 1/2004 | Cheon | G06F 1/20 361/699 |
| 2005/0178526 A1 * | 8/2005 | Naganawa | H01L 23/473 257/E23.098 |
| 2005/0244280 A1 * | 11/2005 | Malone | F04B 19/006 257/E23.098 |
| 2007/0295481 A1 * | 12/2007 | Campbell | H05K 7/20218 165/80.4 |
| 2008/0259566 A1 * | 10/2008 | Fried | H05K 7/20809 165/80.4 |
| 2012/0324933 A1 * | 12/2012 | Louvar | H05K 7/20327 62/196.4 |
| 2013/0050936 A1 * | 2/2013 | Wu | G06F 1/203 361/679.52 |
| 2016/0047605 A1 * | 2/2016 | Mishkinis | F28D 15/06 165/104.25 |
| 2019/0174653 A1 * | 6/2019 | Fan | G06F 1/20 |
| 2019/0289752 A1 * | 9/2019 | Ma | H05K 7/20881 |

* cited by examiner

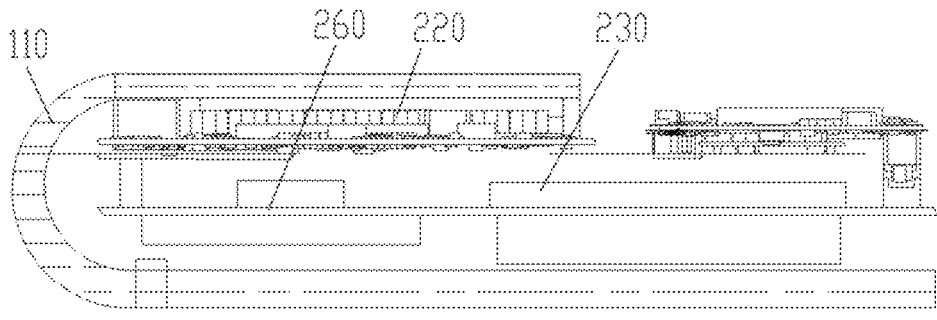

FIG. 14

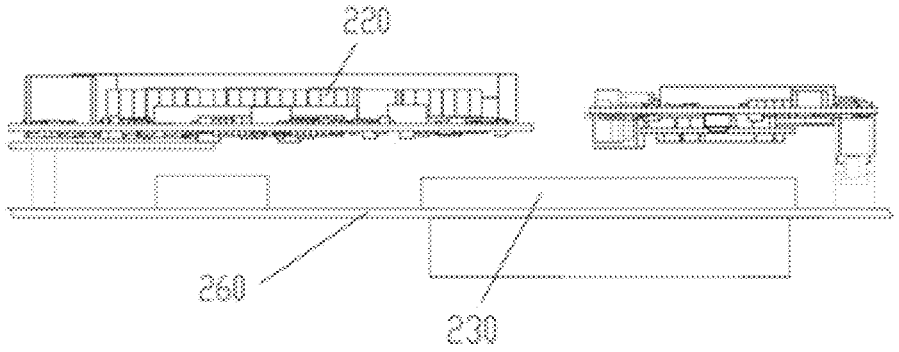

FIG. 15

| | |
|---|---|
| Monitor the heating parameters of the first heat-generating assembly 220 and/or the second heat-generating assembly 230 of the electronic device and/or the operating parameters of the electronic device | 101 |
| Determine the control parameters of the corresponding drive assembly 181 and/or the control valve based on the heating parameters and/or the operating parameters to control the flow rate of the heat dissipation medium in the first heat dissipation branch 110 and/or the second heat dissipation branch 120 based on the control parameters | 102 |

WATER-COOLED HEAT DISSIPATION MODULE, ELECTRONIC DEVICE AND CONTROL METHOD THEREOF

CROSS-REFERENCES TO RELATED APPLICATION

This application claims priority to Chinese Patent Application No. 202111443738.1 filed on Nov. 30, 2021, the entire content of which is incorporated herein by reference.

FIELD OF TECHNOLOGY

The present disclosure relates to a water-cooled heat dissipation module, and an electronic device and a control method for the electronic device.

BACKGROUND

A water-cooled heat dissipation module is a device that people often use, and the water-cooled heat dissipation module is used to dissipate heat for heating structures. However, the design of the water-cooled heat dissipation module is limited and the adaptability is poor.

BRIEF SUMMARY OF THE DISCLOSURE

One aspect of the present disclosure provides a water-cooled heat dissipation module. The water-cooled heat dissipation module includes a first heat dissipation branch for guiding a heat dissipation medium to flow in a first space, a second heat dissipation branch communicating with the first heat dissipation branch for guiding the heat dissipation medium to flow in a second space, and a control assembly for controlling a flow rate of the heat dissipation medium in the first heat dissipation branch and/or the second heat dissipation branch. The first space and the second space are at least partially non-overlapping. In a process in which the water-cooled heat dissipation module is configured to dissipate heat of an electronic device, the control assembly is configured to control the first heat dissipation branch to dissipate heat for at least a part of a first heat-generating assembly of the electronic device, and/or control the second heat dissipation branch to dissipate heat for at least a part of a second heat-generating assembly and/or the first heat-generating assembly of the electronic device.

Another aspect of the present disclosure provides an electronic device. The electronic device includes a first heat-generating assembly; a second heat-generating assembly; a water-cooled heat dissipation module, the water-cooled heat dissipation module including a first heat dissipation branch for guiding a heat dissipation medium to flow in a first space; a second heat dissipation branch communicating with the first heat dissipation branch for guiding the heat dissipation medium to flow in a second space; and a control assembly for controlling a flow rate of the heat dissipation medium in the first heat dissipation branch and/or the second heat dissipation branch; a body having a second receiving cavity, the first heat dissipation branch, the second heat dissipation branch, the first heat-generating assembly, and the second heat-generating assembly being disposed in the second receiving cavity; and a monitor module for monitoring heating parameters of the first heat-generating assembly and/or the second heat-generating assembly and/or operating parameters of the electronic device. The control assembly is configured to control the first heat dissipation branch to dissipate heat for at least part of the first heat-generating assembly based on the heating parameters and/or the operating parameters, and/or control the second heat dissipation branch to dissipate heat for at least part of the second heat-generating assembly and/or the first heat-generating assembly.

Another aspect of the present disclosure provides an electronic device control method for an electronic device. The method includes monitor a plurality of heating parameters of a first heat-generating assembly and/or a second heat-generating assembly of an electronic device and/or a plurality of operating parameters of the electronic device, and determining a plurality of control parameters of a corresponding drive assembly or control valve based on the plurality of heating parameters and/or operating parameters to control a flow rate of a heat dissipation medium in a first heat dissipation branch and/or a second heat dissipation branch based on the control parameters.

BRIEF DESCRIPTION OF THE DRAWINGS

To more clearly illustrate the technical solution in the present disclosure, the accompanying drawings used in the description of the disclosed embodiments are briefly described hereinafter. The drawings are not necessarily drawn to scale. Similar drawing labels in different drawings refer to similar components. Similar drawing labels with different letter suffixes refer to different examples of similar components. The drawings described below are merely some embodiments of the present disclosure. Other drawings may be derived from such drawings by a person with ordinary skill in the art without creative efforts and may be encompassed in the present disclosure.

FIG. 14 is a partial schematic structural diagram of the electronic device according to an embodiment of the present disclosure.

FIG. 15 is a partial schematic structural diagram of the electronic device according to an embodiment of the present disclosure.

FIG. 16 is a flowchart of a control method for an electronic device according to an embodiment of the present disclosure.

REFERENCE NUMERALS

Figure 1:
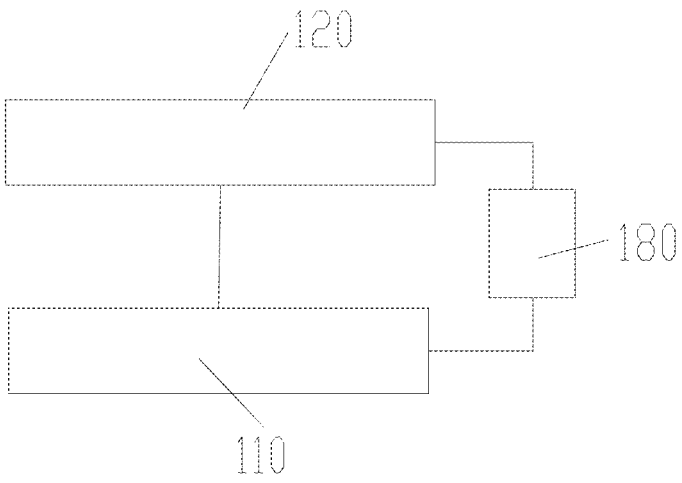
FIG. 1 is a schematic structural diagram of a water-cooled heat dissipation module according to an embodiment of the present disclosure.

110 First heat dissipation branch
120 Second heat dissipation branch
130 Box body
140 Flow guide
141 First receiving cavity
142 First outlet
143 First inlet
150 Drive device
161 Sealing member
162 First heat conducting member
170 Radiator
171 First part of heat dissipation pipe
172 Second part of heat dissipation pipe
173 Third part of heat pipe
180 Control assembly
181 Drive assembly
210 Body
211 Second receiving cavity
220 First heat-generating assembly
230 Second heat-generating assembly
240 First set of fans
250 Second set of fans
260 Motherboard

DETAILED DESCRIPTION

The present disclosure is further described in detail in connection with accompanying drawings and specific embodiments. Specific embodiments described here are merely used to explain the present disclosure and not limit the present disclosure.

In the present disclosure, unless otherwise specified and limited, the term "connected" should be understood in a broad sense. For example, the term may include electrical connection, communication between two inner components, direct connection, connection through a medium therebetween. Those skilled in the art may understand specific meaning of the above-described term according to specific situation.

Terms of "first\second\third" of embodiments of the present disclosure only distinguish similar objects, and does not represent a specific order of objects. The specific order or sequence of the "first\second\third" is allowed to be interchangeable. The objects distinguished by "first\second\third" are interchangeable under an appropriate situation. As such, embodiments of the present disclosure described here may describe sequence embodiments in addition to the drawings or described sequences.

The water-cooled heat dissipation module described in the embodiments of the present disclosure will be described in detail below with reference to FIGS. 1-9.

As shown in FIG. 1, the water-cooled heat dissipation module includes a first heat dissipation branch 110, a second heat dissipation branch 120 communicating with the first heat dissipation branch 110, and a control assembly 180. The first heat dissipation branch 110 may be used to guide a heat dissipation medium to flow in a first space. The second heat dissipation branch 120 may communicate with the first heat dissipation branch 110, and the second heat dissipation branch 120 may be used to guide the heat dissipation medium to flow in a second space. The control assembly 180 may be used to control the flow rate of the heat dissipation medium in the first heat dissipation branch 110 and/or the second heat dissipation branch 120. The first space and the second space may be at least partially non-overlapping. In the process in which the water-cooled heat dissipation module is configured to dissipate heat from an electronic device, the control assembly 180 may control the first heat dissipation branch 110 to dissipate heat to at least part of a first heat-generating assembly 220 of the electronic device, and/or control the second heat dissipation branch 120 to dissipate heat to at least part of a second heat-generating assembly 230 and/or the first heat-generating assembly 220 of the electronic device. The two heat dissipation branches can be controlled by the control assembly 180 to dissipate heat for at least part of the first heat-generating assembly 220 and for at least part of the second heat-generating assembly 230 to dissipate, thereby adding the working mode of the water-cooled heat dissipation module and improving the adaptability of the water-cooled heat dissipation module.

In the embodiments of the present disclosure, the structure of the first heat dissipation branch 110 is not limited. For example, the first heat dissipation branch 110 may include at least two first pipes, and the at least two first pipes may include a heat dissipation medium.

In the embodiments of the present disclosure, the structure of the second heat dissipation branch 120 is not limited. For example, the second heat dissipation branch 120 may include at least two second pipes, and the at least two second pipes may include a heat dissipation medium.

Figure 2:
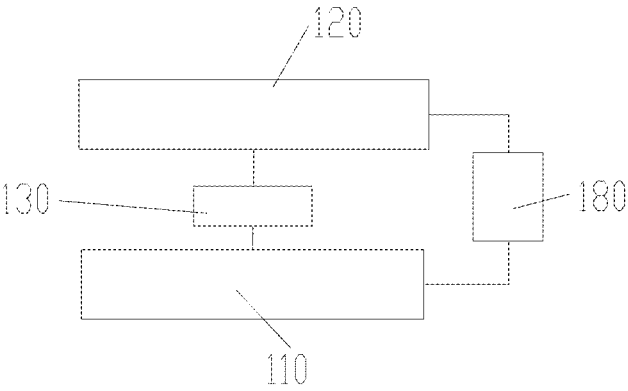
FIG. 2 is a schematic structural diagram of the water-cooled heat dissipation module according to an embodiment of the present disclosure.

In the embodiments of the present disclosure, the manner in which the second heat dissipation branch 120 communicates with the first heat dissipation branch 110 is not limited. For example, the second heat dissipation branch 120 may be in direction communication with the pipe body of the first heat dissipation branch 110. In another example, the pipes of the second heat dissipation branch 120 and the first heat dissipation branch 110 may also communicate with each other through other structures. As an example, as shown in FIG. 2, the water-cooled heat dissipation module can further include at least one box body 130. The box body 130 may be used for receiving the heat dissipation medium, and the first heat dissipation branch 110 and the second heat dissipation branch 120 may pass through the box body 130 to realize communication. As another example, the water-cooled heat dissipation module may further include a drive assembly 181. The first heat dissipation branch 110 and the second heat dissipation branch 120 may communicate with different inlets and outlets of the drive assembly 181 respectively. In this way, the first heat dissipation branch 110 and the second heat dissipation branch 120 can communicate with each other through the drive assembly 181.

In the embodiments of the present disclosure, the heat dissipation medium is not limited. For example, the heat dissipation medium may be water.

In the embodiments of the present disclosure, the first space and the second space may be completely non-overlapping, or may only be partially non-overlapping.

In the embodiments of the present disclosure, the structures of the first heat-generating assembly 220 and the second heat-generating assembly 230 are not limited as long as the first heat-generating assembly 220 and the second heat-generating assembly 230 can generate heat.

In the embodiments of the present disclosure, the control assembly 180 can be used to control the flow rate of the heat dissipation medium in the first heat dissipation branch 110, control the flow rate of the heat dissipation medium in the second heat dissipation branch 120, and control the flow rate of the heat dissipation medium in both the first heat dissipation branch 110 and the second heat dissipation branch 120.

In the embodiments of the present disclosure, the structure of the control assembly 180 is not limited. For example, the control assembly 180 may include at least one control valve. The at least one control valve may be disposed in the first heat dissipation branch 110, the second heat dissipation branch 120, or both the first heat dissipation branch 110 and the second heat dissipation branch 120. The at least one control valve may be disposed in the first heat dissipation branch 110 to control the flow rate of the heat dissipation medium in the first heat dissipation branch 110. The at least one control valve may be disposed in the second heat dissipation branch 120 to control the flow rate of the heat dissipation medium in the second heat dissipation branch 120. The at least one control valve may be simultaneously disposed in the first heat dissipation branch 110 and the second heat dissipation branch 120 to simultaneously control the flow rate of the heat dissipation medium in the first heat dissipation branch 110 and the second heat dissipation branch 120.

Figure 3:
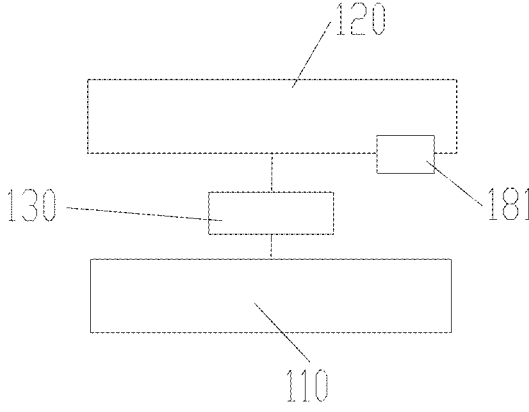
FIG. 3 is a schematic structural diagram of the water-cooled heat dissipation module according to an embodiment of the present disclosure.
Figure 4:
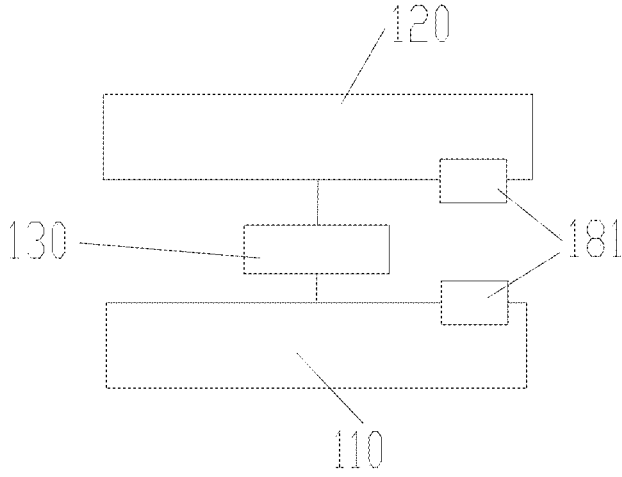
FIG. 4 is a schematic structural diagram of the water-cooled heat dissipation module according to an embodiment of the present disclosure.

The control assembly 180 may include the drive assembly 181. In the embodiments of the present disclosure, the number of the drive assembly 181 is not limited. As an example, as shown in FIG. 3, the control assembly 180 includes one drive assembly 181. The drive assembly 181 is disposed in the second heat dissipation branch 120 to drive the heat dissipation medium to flow at least in the heat branch of the second heat dissipation branch 120 to drive the heat dissipation medium to flow at least in the connected second heat dissipation branch 120 and the first heat dissipation branch 110. As another example, as shown in FIG. 4, the control assembly 180 can include at least two drive assemblies 181. The at least two drive assemblies 181 are respectively disposed in the first heat dissipation branch 110 and the second heat dissipation branch 120. The drive assembly 181 disposed in the first heat dissipation branch 110 can drive the heat dissipation medium to flow at least in the first heat dissipation branch 110, and the drive assembly 181 disposed in the second heat dissipation branch 120 can drive the heat dissipation medium to flow at least in the second heat dissipation branch 120. The drive assembly 181 disposed in the second heat dissipation branch 120 and the drive assembly 181 disposed in the first heat dissipation branch 110 can be used to drive the heat dissipation medium to flow at least in the second heat dissipation branch 120 and the first heat dissipation branch 110.

Of course, the control assembly 180 may include the drive assembly 181 and at least one control valve.

In some optional implementation of the embodiments of the present disclosure, the drive assembly 181 may include a flow guide 140 and a drive device 150. The flow guide may include a first receiving cavity and at least two sets of outlets/inlets, and the at least two sets of outlets/inlets may be respectively communicating with the first heat dissipation branch and the second heat dissipation branch. The drive device may be disposed in the first receiving cavity. The drive device may be used for driving the heat dissipation medium to flow in the first heat dissipation branch and/or the second heat dissipation branch through the inlets/outlets. Through the flow guide 140 and the drive device 150, the heat dissipation medium can flow in the first heat dissipation branch 110 and the second heat dissipation branch 120 based on different inlets and outlets, thereby increasing the working mode of the water-cooled heat dissipation module.

In some embodiments, the flow guide 140 may include a first set of inlets and outlets and a second set of inlets and outlets. The first set of inlets and outlets may communicate with the first heat dissipation branch 110, and the second set of inlets and outlets may communicate with the second heat dissipation branch 120. The drive device 150 may be configured to drive the heat dissipation medium to flow in the first heat dissipation branch 110 based on the first set of inlets and outlets, and the drive device 150 may be configured to drive the heat dissipation medium to flow in the second heat dissipation branch 120 based on the second set of inlets and outlets.

The structure of the drive device 150 is not limited in the embodiments of the present disclosure. For example, the drive device 150 may be a pump. Of course, the drive assembly 181 may also include the drive device 150. In this case, the drive assembly 181 may include an inlet and an outlet.

In some embodiments, the drive device 150 may include one second outlet and one second inlet, and the flow guide 140 may include at least two first outlets 142 and at least two first inlets 143. By arranging the drive device 150 in the first receiving cavity 141, the flow guide 140 can increase the number of inlets and outlets of the drive assembly 181.

In some embodiments, the cross-sectional area of the at least two first outlets 142 may be larger than the cross-sectional area of the second outlet, and the cross-sectional area of the at least two first inlets 143 may be larger than the cross-sectional area of the second inlet to increase the cross-sectional area of the inlets and outlets of the drive assembly 181 through the flow guide 140. Under the condition that the power of the drive device 150 is the same, the inlets and outlets with larger area can reduce the flow speed of the heat dissipation medium, such that the heat dissipation medium can exchange heat more completely. Therefore, under the condition of the power of the drive device 150 remains unchanged, the heat dissipation capability of the water-cooled heat dissipation module can also be improved. In addition, when the same heat dissipation capability needs to be provided, the drive device 150 can reduce the input power, thereby reducing the noise when the drive device 150 of the water-cooled heat dissipation module works at high power.

In some embodiments, the first set of inlets and outlets may include at least one first outlet 142 and at least one first inlet 143. The second set of inlets and outlets may include at least one first outlet 142 and at least one first inlet 143.

Figure 5:
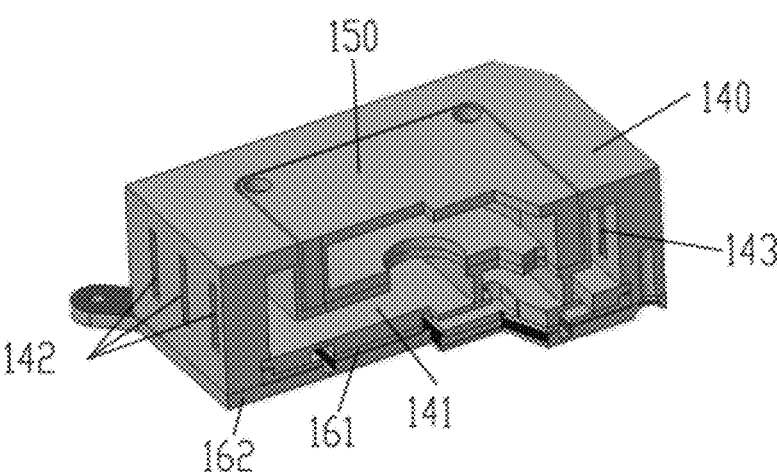
FIG. 5 is a schematic structural diagram of a drive assembly of the water-cooled heat dissipation module according to an embodiment of the present disclosure.

In some embodiments, as shown in FIG. 5, the drive assembly 181 may further include a sealing member 161. The sealing member 161 may be used to seal a first side of the drive device 150 into the first receiving cavity 141 of the flow guide 140 to prevent the heat dissipation medium from flowing out from the first side of the drive device 150. In some embodiments, the first side of the drive device 150 may be the side where the rotation axis of the drive device 150 is located.

The structure of the flow guide 140 is not limited in the embodiments of the present disclosure. For example, the material of the flow guide 140 may be aluminum or copper. The second heat dissipation branch 120 may also dissipate heat for the second heat-generating assembly 230 based on the flow guide 140. For example, as shown in FIG. 5, the drive assembly 181 may further include a first heat conducting member 162. The first heat conducting member 162 may be attached to one side of the flow guide 140, and the first heat conducting member 162 may be used for contacting the second heat-generating assembly 230, such that the second heat dissipation branch 120 can dissipate heat based on the first heat conducting member 162 and the flow guide 140 in the drive assembly 181. Of course, the drive assembly 181 may not be provided with the first heat conducting member 162, and the flow guide 140 may also be in direct contact with the second heat-generating assembly 230. In some cases, since the heat dissipation medium is accommodated in the first receiving cavity 141, the heat dissipation capability of the second heat dissipation branch 120 may be improved by the contact between the flow guide 140 containing more heat dissipation medium and the second heat-generating assembly 230.

In some optional implementation of the embodiments of the present disclosure, the second heat dissipation branch 120 may include a first part of a heat dissipation pipe 171 and a second part of the heat dissipation pipe 172 disposed on a radiator 170. The first part of the heat dissipation pipe 171 may be used to dissipate heat to at least part of the second heat-generating assembly 230. The second part of the heat dissipation pipe 172 may be connected in parallel with the first heat dissipation branch 110, and the second part of the heat dissipation pipe 172 may independently dissipate heat for at least part of the first heat-generating assembly 220 and at least part of the second heat-generating assembly 230. The second part of the heat dissipation pipe 172 may dissipate heat for at least part of the first heat-generating assembly 220 and at least part of the second heat-generating assembly 230 together with the first heat dissipation branch 110.

In some embodiments, the first part of the heat dissipation pipe 171 may communicate with the first set of inlets and outlets of the drive assembly 181, and the second part of the heat dissipation pipe 172 may communicate with the first set of inlets and outlets of the drive assembly 181. The drive assembly 181 may drive the heat dissipation medium to flow in the first part of the heat dissipation pipe 171 and the second part of the heat dissipation pipe 172 at the same time. Since the second part of the heat dissipation pipe 172 can be connected to the first heat dissipation branch 110 in parallel, the drive assembly 181 may drive the heat dissipation medium to flow in the first heat dissipation branch 110 through the second part of the heat dissipation pipe 172.

Figure 6:
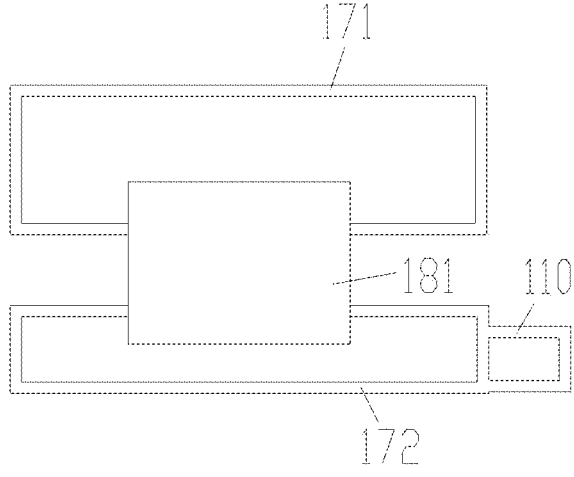
FIG. 6 is a schematic structural diagram of the water-cooled heat dissipation module according to an embodiment of the present disclosure.

The implementation of the parallel connect between the second part of the heat dissipation pipe 172 and the first heat dissipation branch 110 is not limited in the embodiments of the present disclosure. For example, as shown in FIG. 6, the first heat dissipation branch 110 is connected in parallel with a part of the heat dissipation pipe of the second part of the heat dissipation pipe 172.

Figure 7:
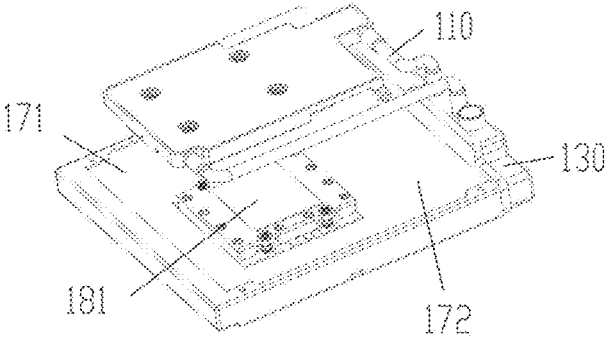
FIG. 7 is a partial schematic structural diagram of the water-cooled heat dissipation module according to an embodiment of the present disclosure.
Figure 8:
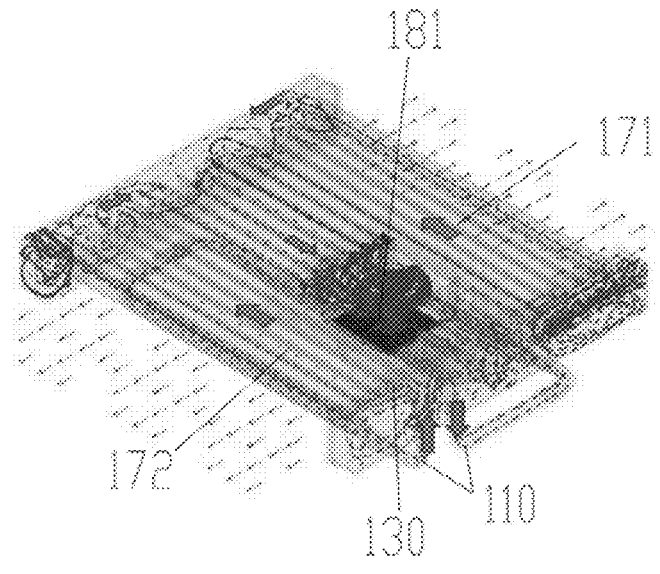
FIG. 8 is a partial schematic structural diagram of the water-cooled heat dissipation module according to an embodiment of the present disclosure.

In another example, as shown in FIG. 7 and FIG. 8, the first heat dissipation branch 110 is connected in parallel with the second part of the heat dissipation pipe 172 through the box body 130. In this case, the tank water may communicate only with the second part of the heat dissipation pipe 172, or may communicate with the second part of the heat dissipation pipe 172 and the first part of the heat dissipation pipe 171 at the same time. When the tank water communicates with the second part of the heat dissipation pipe 172 and the first part of the heat dissipation pipe 171, since the first heat dissipation branch 110 is in communication with the part of the box body 130 close to the second part of the heat dissipation pipe 172, when the drive assembly 181 is working, a first part of the heat dissipation medium can flow in the first part of the heat dissipation pipe 171 through the first set of inlets and outlets of the drive assembly 181, and a second part of the heat dissipation medium can flow in the second part of the heat dissipation pipe 172 and the first heat dissipation branch 110 through the second set of inlets and outlets of the drive assembly 181, as shown in FIG. 8.

It should be noted that in order to reduce the installation space of the drive assembly 181, as shown in FIG. 7 and FIG. 8, the drive assembly 181 can be disposed in the space surrounded by the first part of the heat dissipation pipe 171 and the second part of the heat dissipation pipe 172.

The manner in which the first part of the heat dissipation pipe 171 is used to dissipate heat of at least part of the second heat-generating assembly 230 is not limited in the embodiments of the present disclosure. For example, the first part of the heat dissipation pipe 171 may be in contact with at least a part of the second heat-generating assembly 230. In another example, the drive assembly 181 may include the flow guide 140. The flow guide 140 may be in contact with at least a part of the second heat-generating assembly 230, and the first part of the heat dissipation pipe 171 may dissipate heat of at least part of the second heat-generating assembly 230 through the flow guide 140.

The manner in which the second part of the heat dissipation pipe 172 can independently dissipate heat for at least a part of the first heat-generating assembly 220 and at least a part of the second heat-generating assembly 230 is not limited in the embodiments of the present disclosure. For example, the second part of the heat dissipation pipe 172 may be in contact with at least a part of the first heat-generating assembly 220 and at least a part of the second heat-generating assembly 230.

The manner in which the second part of the heat dissipation pipe 172 and the first heat dissipation branch 110 can dissipate heat for at least a part of the first heat-generating assembly 220 and at least a part of the second heat-generating assembly 230 is not limited in the embodiments of the present disclosure. For example, the second part of the heat dissipation pipe 172 may be in contact with at least a part of the second heat-generating assembly 230, and the first heat dissipation branch 110 may be in contact with at least a part of the first heat-generating assembly 220. In another example, the drive assembly 181 may include the flow guide 140, and the flow guide 140 may be in contact with at least a part of the second heat-generating assembly 230. In this case, the second part of the heat dissipation pipe 172 may dissipate heat for at least a part of the second heat-generating assembly 230 through the flow guide 140, and the first heat dissipation branch 110 may be in contact with at least a part of the first heat-generating assembly 220.

In some optional implementation of the embodiments of the present disclosure, the second heat dissipation branch 120 may include the first part of the heat dissipation pipe 171, the second part of the heat dissipation pipe 172, and a third part of the heat dissipation pipe 173. The first part of the heat dissipation pipe 171 may be used to dissipate heat for at least a part of the second heat-generating assembly 230. The second part of the heat dissipation pipe 172 may be used to dissipate heat for at least a part of the first heat-generating assembly 220 and at least a part of the second heat-generating assembly 230. The third part of the heat dissipation pipe 173 may be arranged in parallel or in series with the first heat dissipation branch 110 to dissipate heat for at least a part of the first heat-generating assembly 220.

In some embodiments, the drive assembly 181 may include a first set of inlets and outlets, a second set of inlets and outlets, and a third set of inlets and outlets. The first set of inlets and outlets may communicate with the first part of the heat dissipation pipe 171, and the drive assembly 181 may be configured to drive the heat dissipation medium to flow in the first part of the heat dissipation pipe 171 through the first group of inlets and outlets. The second set of inlets and outlets may communicate with the second part of the heat dissipation pipe 172, and the drive assembly 181 may be configured to drive the heat dissipation medium to flow in the second part of the heat dissipation pipe 172 through the second set of inlets and outlets. The third set of inlets and outlets may communicate with the third part of the heat dissipation pipe 173, and the third part of the heat dissipation pipe 173 may be arranged in parallel or in series with the first heat dissipation branch 110. The drive assembly 181 may be configured to drive the heat dissipation medium to flow in the second part of the heat dissipation pipe 172 and the first heat dissipation branch 110 through the third set of inlets and outlets.

The manner in which the first part of the heat dissipation pipe 171 can be used to dissipate heat for at least a part of the second heat-generating assembly 230 has been described in detail in the foregoing description, which will not be repeated here.

The manner in which the second part of the heat dissipation pipe 172 can be used to dissipate heat for at least a part of the first heat-generating assembly 220 and at least a part of the second heat-generating assembly 230 is not limited in the embodiments of the present disclosure. For example, the second part of the heat dissipation pipe 172 may be in contact with least a part of the first heat-generating assembly 220 and at least a part of the second heat-generating assembly 230 at the same time. In another example, the second part of the heat dissipation pipe 172 may be in contact with at least a part of the first heat-generating assembly 220, and the drive assembly 181 may include the flow guide 140. The flow guide 140 may be in contact with at least a part of the second heat-generating assembly 230, and the second part of the heat dissipation pipe 172 may dissipate heat for at least a part of the second heat-generating assembly 230 through the flow guide 140.

Figure 9:
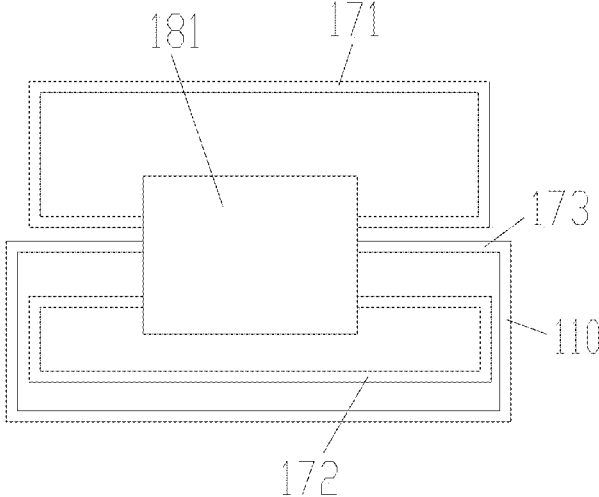
FIG. 9 is a schematic structural diagram of the water-cooled heat dissipation module according to an embodiment of the present disclosure.

In some embodiments, the third part of the heat dissipation pipe 173 and the first heat dissipation branch 110 may be arranged in parallel. The parallel connection between the third part of the heat dissipation pipe 173 and the first heat dissipation branch 110 may be similar to the parallel connection between the second part of the heat dissipation pipe 172 and the first heat dissipation branch 110, and details will not be repeated here. In other embodiments, the third part of the heat dissipation pipe 173 and the first heat dissipation branch 110 may be arranged in series. In this case, as shown in FIG. 9, the first heat dissipation branch 110 communicates with two ports of the third part of the heat dissipation pipe 173.

In some embodiments, the first heat dissipation branch 110 may be in contact with at least a part of the first heat-generating assembly 220, and the third part of the heat dissipation pipe 173 may dissipate heat for at least a part of the first heat-generating assembly 220 through the first heat dissipation branch 110. Of course, the third part of the heat dissipation pipe 173 may also dissipate heat for at least a part of the second heat-generating assembly 230. The manner in which the third part of the heat dissipation pipe 173 dissipates heat for at least a part of the second heat-generating assembly 230 may be similar to the manner in which the first part of the heat dissipation pipe 171 dissipate heat for at least a part of the second heat-generating assembly 230, and details will not be repeated here.

Consistent with the present disclosure, the water-cooled heat dissipation module can include the first heat dissipation branch 110 for guiding the heat dissipation medium to flow in the first space, the second heat dissipation branch 120 in communication with the first heat dissipation branch 110 for guiding the heat dissipation medium to flow in the second space, and the control assembly 180 for controlling the flow rate of the heat dissipation medium in the first heat dissipation branch 110 and/or the second heat dissipation branch 120, where the first space and the second space at least partially non-overlap. In the process in which the water-cooled heat dissipation module is configured to dissipate heat from an electronic device, the control assembly 180 can control the first heat dissipation branch 110 to dissipation heat for at least a part of the first heat-generating assembly 220 of the electronic device, and/or control the 120 to dissipate heat for at least a part of the second heat-generating assembly 230 and/or the first heat-generating assembly 220 of the electronic device. The two heat dissipation branches can be controlled by the control assembly 180 to dissipate heat for at least part of the first heat-generating assembly 220 and for at least part of the second heat-generating assembly 230 to dissipate, thereby adding the working mode of the water-cooled heat dissipation module and improving the adaptability of the water-cooled heat dissipation module.

An embodiment of the present disclosure further provides an electronic device. The electronic device may include a first heat-generating assembly 220, a second heat-generating assembly 230, the water-cooled heat dissipation module provided in the embodiments of the present disclosure, a body 210, and a monitor module. The body 210 may include a second receiving cavity 211, and the first heat dissipation branch 110, the second heat dissipation branch 120, the first heat-generating assembly 220 and the second heat-generating assembly 230 may be disposed in the second receiving cavity 211. The monitor module may be used to monitor the heating parameters of the first heat-generating assembly 220 and/or the second heat-generating assembly 230 and/or the operating parameters of the electronic device. The control assembly 180 may control the first heat dissipation branch 110 to dissipate heat for at least a part of the first heat-generating assembly 220 based on the heating parameters and/or the operating parameters, and/or control the second heat dissipation branch 120 to dissipate heat for at least a part of the second heat-generating assembly 230 and/or the first heat-generating assembly 220. In this case, the two heat dissipation branches can be controlled through the monitor module and the control assembly 180, which can not only dissipate heat for at least a part of the first heat-generating assembly 220, but also dissipate heat for at least a part of the second heat-generating assembly 230, thereby increasing the working mode of the water-cooled heat dissipation module and improving the adaptability of the water-cooled heat dissipation module.

The relevant features of the water-cooled heat dissipation module have been described in the foregoing embodiments, which will not be repeated here.

The structure of the electronic device is not limited in the embodiments of the present disclosure. For example, the electronic device may be a processor of a computer, or the electronic device may be a notebook computer.

The structure of the first heat-generating assembly 220 is not limited in the embodiments of the present disclosure. For example, at least a part of the first heat-generating assembly 220 may be a graphic processing unit (GPU).

The structure of the second heat-generating assembly 230 is not limited in the embodiments of the present disclosure. For example, at least a part of the second heat-generating assembly 230 may be a central processing unit (CPU).

In the embodiments of the present disclosure, the monitor module may be configured to monitor the heating parameters of the first heat-generating assembly 220, monitor the heating parameters of the second heat-generating assembly 230, monitor the heating parameters of the first heat-generating assembly 220 and the second heat-generating assembly 230, and monitor the operating parameters of the electronic device.

The heating parameters are not limited in the embodiments of the present disclosure. For example, the heating parameters may include the amount of heat generated and the temperature.

The operating parameters are not limited in the embodiments of the present disclosure. For example, the operating parameters may include at least one of an operation mode, an operation application, and an operation duration.

The structure of the monitor module is not limited in the embodiments of the present disclosure. For example, the monitor module may include a temperature sensor. The temperature sensor may be used to monitor the heating parameters of the second heat-generating assembly 230, the heating parameters of the first heat-generating assembly 220, and the heating parameters of the first heat-generating assembly 220 and the second heat-generating assembly 230. In another example, the monitor module may be used to determine the operation mode, the operation application, the operation duration, etc. of the electronic device.

In the embodiments of the present disclosure, the control assembly 180 may control the first heat dissipation branch 110 to dissipate heat for at least a part of the first heat-generating assembly 220 based on the heating parameters and/or the operating parameters. The control assembly 180 may control the second heat dissipation branch 120 to dissipate heat for at least a part of the second heat-generating assembly 230 and/or the first heat-generating assembly 220 based on the heating parameters and/or the operating parameters. The control assembly 180 may also control the first heat dissipation branch 110 to dissipate heat for at least a part of the first heat-generating assembly 220 based on the heating parameters and/or the operating parameters and control the second heat dissipation branch 120 to dissipate heat for at least a part of the second heat-generating assembly 230 and/or the first heat-generating assembly 220 based on the heating parameters and/or the operating parameters.

For example, the control assembly 180 may include the drive assembly 181, the control assembly 180 may include a control valve, and the control assembly 180 may include both the drive assembly 181 and the control valve. The monitor module may be used to monitor the heating parameters of the first heat-generating assembly 220 and/or the second heat-generating assembly 230 of the electronic device and/or the operating parameters of the electronic device. The control assembly 180 may be configured to determine the control parameters of the corresponding drive assembly 181 and/or control valve based on the heating parameters and/or the operating parameters to control the flow rate of the heat dissipation medium in the first heat dissipation branch 110 and/or the second heat dissipation branch 120 based on the control parameters.

In a first example, the control assembly 180 may be configured to determine a target heating area based on the heating parameters and/or the operating parameters, and determine the control parameters of the drive assembly 181 and/or the control valve corresponding to the target heating area.

In the first example, the manner in which the control assembly 180 is used to determent the target heating area based on the heating parameters is not limited. For example, the control assembly 180 may be configured to determine the area corresponding to the first heat-generating assembly 220 as the target heating area based on the temperature of the first heat-generating assembly 220 detected by the monitor module being greater than a first set value. In another example, the control assembly 180 may be configured to determine the area corresponding to the second heat-generating assembly 230 as the target heating area based on the temperature of the second heat-generating assembly 230 detected by the monitor module being greater than a second set value. In another example, the control assembly 180 may be configured to determine the area corresponding to the second heat-generating assembly 230 and the area corresponding to the first heat-generating assembly 220 as the target heating areas based on the temperature of the second heat-generating assembly 230 detected by the monitor module being greater than the second set value and the temperature of the first heat-generating assembly 220 detected by the monitor module being greater than the first set value.

In the first example, the manner in which the control assembly 180 is used to determine the target heating area based on the operating parameters of the electronic device is not limited. For example, the control assembly 180 may be configured to predict the corresponding area of the second heat-generating assembly 230 and/or the corresponding area of the first heat-generating assembly 220 as the target heating area based on at least one of the operation mode, the operation application, and the operation duration of the electronic device monitored by the monitor module. As an example, the operation mode of the electronic device monitored by the monitor module may be a first operation mode. In the first operation mode, the power consumption of the first heat-generating assembly 220 may be relatively large. In this case, the control assembly 180 may be configured to predict that the corresponding area of the first heat-generating assembly 220 is the target heating area based on the electronic device monitored by the monitor module being in the first operation mode. In another example, the monitor module may monitor the electronic device running a first application. In the first application, the power consumption of the second heat-generating assembly 230 may be relatively large. In this case, the control assembly 180 may be configured to predict that the corresponding area of the second heat-generating assembly 230 is the target heating area based on the operation of the first application of the electronic device monitored by the monitor module. In another example, the monitor module may monitor the operation duration of the first heat-generating assembly 220 and/or the second heat-generating assembly 230 of the electronic device longer than a third set value. The control assembly 180 may be configured to determine the corresponding area of the first heat-generating assembly 220 and/or the corresponding area of the second heat-generating assembly 230 as the target heating area based on the operation duration of the first heat-generating assembly 220 and/or the second heat-generating assembly 230 monitored by the monitor module being greater than the third set value.

In the first example, the target heating area may be determined based on the heating parameters and/or the operating parameters, and the manner of determining the control parameters of the drive assembly 181 and/or the control valve corresponding to the target heating area is not limited.

For example, the target heating area may be determined or predicted to be the area corresponding to the first heat-generating assembly 220 based on the heating parameters and/or the operating parameters. At this time, the control assembly 180 may determine that the power of the drive assembly 181 driving the first heat dissipation branch 110 is increased, the control assembly 180 may determine that the valve of the control value in the first heat dissipation branch 110 is opened or increased, or the control assembly 180 may determined that the valve of the control valve located in the first heat dissipation branch 110 is opened or increased, and the power of the drive assembly 181 driving the first heat dissipation branch 110 is increased.

In a second example, the control assembly 180 may be configured to determine the target heating area based on the heating parameters and/or the operating parameters, and determined the control parameters of the drive assembly 181 and/or the control valve corresponding to the target heating area.

In the second example, the use of the control assembly 180 to determined the target heating area based on the operating parameters of the electronic device has been described in the first example, and will not be repeated here.

In the second example, the use of the control assembly 180 to determine the target heating area based on the heating parameters and/or operating parameters, and determine the control parameters of the drive assembly 181 and/or the control valve corresponding to the target heating area has been described in the first example, and will not be repeated here.

In the second example, the electronic device may further include a fan. The control assembly 180 may be configured to determine the target heating area based on the heating parameters and/or the operating parameters, and the method of determining the control parameters of the fan corresponding to the target heating area is not limited.

In some embodiments, the control parameters of the fan may include the rotational speed of the fan and the power consumption of the fan.

For example, the target heating area may be determined to be the area corresponding to the second heat-generating assembly 230 based on the heating parameters and/or the operating parameters. At this time, the control assembly 180 may determine that the power of the drive assembly 181 driving the second heat dissipation branch 120 is increased, the control assembly 180 may determine that the valve of the control valve located in the second heat dissipation branch 120 is opened or increased, the control assembly 180 may determine that the rotational speed of the fan for dissipating heat of the second heat-generating assembly 230 is increased, or the control assembly 180 may determine that the valve of the control valve located in the second heat dissipation branch 120 is opened or increased, power of the drive assembly 181 driving the second heat dissipation branch 120 is increased, and the rotational speed of the fan for dissipating heat of the second heat-generating assembly 230 is increased.

In some optional implementation of the embodiments of the present disclosure, a bottom wall of the body 210 may include an air inlet. The air inlet may correspond to the first side surface of the radiator 170 of the water-cooled heat dissipation module, such that the air from the outside environment can be introduced into the gaps between the heat dissipation pipes of the radiator 170 from the air inlet.

In some embodiments, the first side surface of the radiator 170 may be a relatively large surface. As an example, the first side surface of the radiator 170 may be the largest surface of the radiator 170.

In some embodiments, the radiator 170 may be attached to a bottom wall of the body 210.

Figure 12:
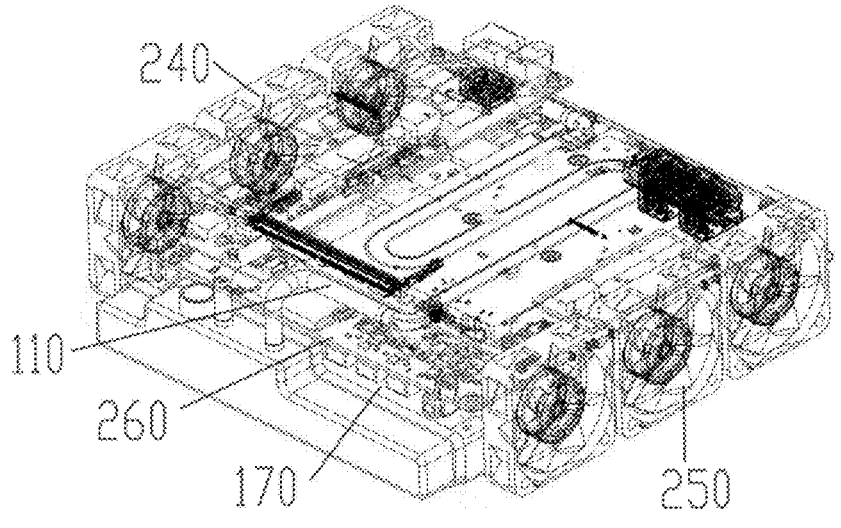
FIG. 12 is a partial schematic structural diagram of the electronic device according to an embodiment of the present disclosure.
Figure 13:
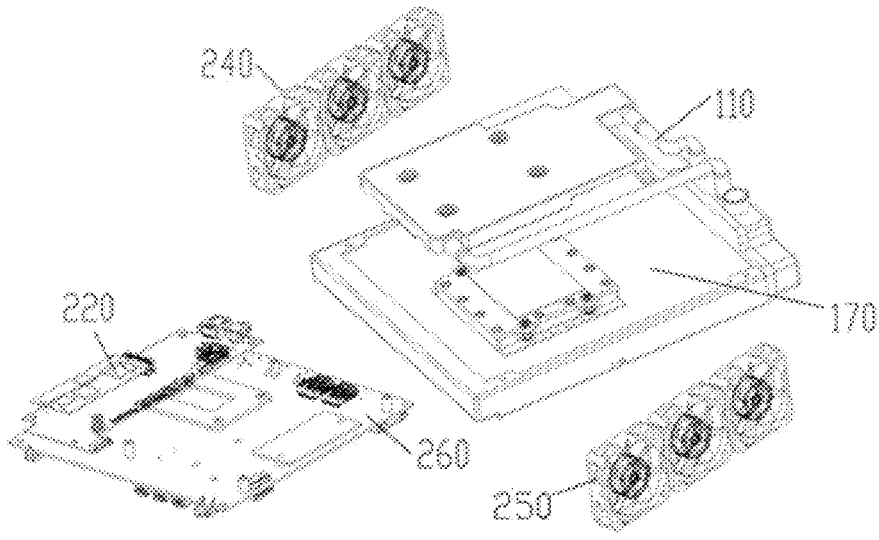
FIG. 13 is a partial exploded view of the electronic device according to an embodiment of the present disclosure.

As shown in FIG. 12 and FIG. 13, the electronic device further includes a first set of fans 240 and a second set of fans 250. The first set of fans 240 are disposed on the body 210. The first set of fans 240 may corresponding to the position of the first air outlet on the first side wall of the body 210, and the first set of fans 240 may be used to guide the air passing through the radiator 170 out of the first air outlet. In some embodiments, the first side wall may be adjacent to the bottom wall. The second set of fans 250 are disposed on the body 210. The second set of fans 250 may correspond to the position of the second air outlet on a second side wall of the body 210, and the second set of fans 250 may be used to guide the air passing through the radiator 170 out of the second air outlet. The air can be led out from the air outlets on the two side walls of the body 210, which can increase the area of the air outlets and improve the heat dissipation capability of the electronic device.

In some embodiments, both the second side wall and the first side wall may be disposed adjacent to the bottom wall. Of course, the second side wall and the first side wall may also be disposed opposite to each other, as shown in FIG. 12 and FIG. 13.

The structures of the first set of fans 240 and the second set of fans 250 are not limited in the embodiments of the present disclosure. For example, the first set of fans 240 and the second set of fans 250 may each include three fans.

In addition, after the target heating area is determined or predicted, the control assembly 180 may simultaneously control the water-cooled heat dissipation module, the first set of fans 240, and the second set of fans 250 to dissipate heat simultaneously.

In some optional implementation of the embodiments of the present disclosure, the electronic device may further include a motherboard 260. The motherboard 260 may be disposed in the second receiving cavity 211.

The setting position of the second heat-generating assembly 230 and the first heat-generating assembly 220 are not limited in the embodiments of the present disclosure.

For example, the second heat-generating assembly 230 and the first heat-generating assembly 220 may be arranged on both sides of the motherboard 260. At this time, the second heat-generating assembly 230 and the first heat-generating assembly 220 may be arranged on opposite sides of the motherboard 260.

Figure 10:
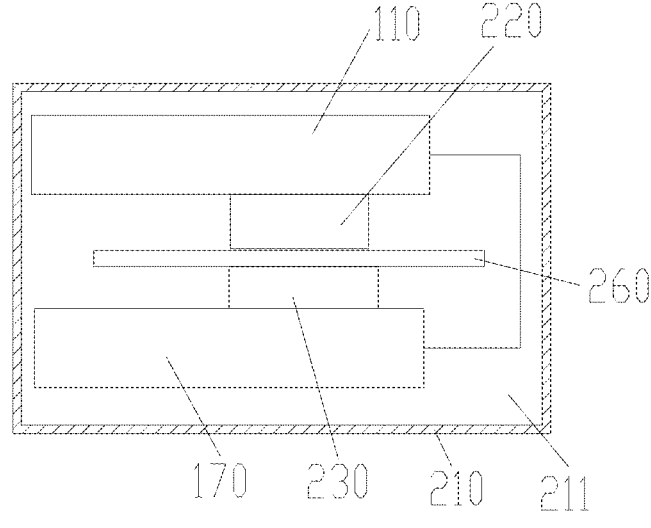
FIG. 10 is a schematic structural diagram of an electronic device according to an embodiment of the present disclosure.

In this case, the radiator 170 may be arranged between the motherboard 260 and the bottom wall of the body 210, the second heat-generating assembly 230 may be arranged between the motherboard 260 and the radiator 170, and the first heat dissipation branch 110 may be arranged between the first heat-generating assembly 220 and the second heat-generating assembly 230. Of course, the first heat dissipation branch 110 may be disposed on the side of the first heat-generating assembly 220 facing away from the second heat-generating assembly 230, as shown in FIG. 10.

In another example, the second heat-generating assembly 230 and the first heat-generating assembly 220 may be disposed on the same side of the motherboard 260.

Figure 11:
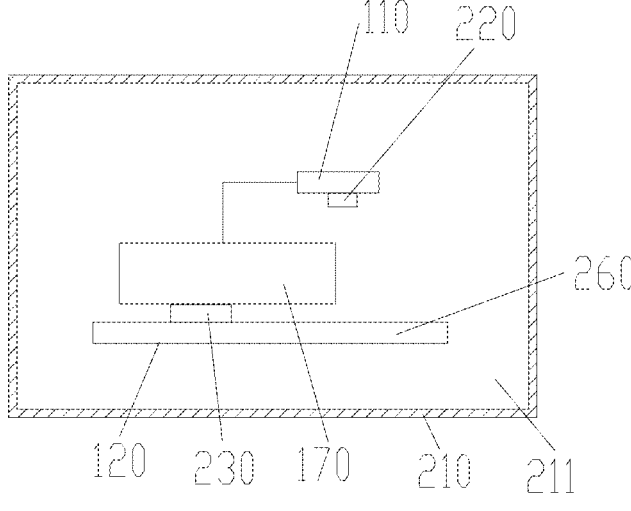
FIG. 11 is a schematic structural diagram of the electronic device according to an embodiment of the present disclosure.

In this case, the radiator 170 may be disposed on a plane between the motherboard 260 and the first heat-generating assembly 220, and the first heat dissipation branch 110 may be disposed on the first heat-generating assembly 220 facing away from the radiator 170, as shown in FIG. 11.

Of course, the first heat dissipation branch 110 may also abut against the side of the first heat-generating assembly 220 and the second heat-generating assembly 230 facing away from the radiator 170 at the same time, as shown in FIG. 14 and FIG. 15. In this case, the first heat dissipation branch 110 may be curved and disposed around the motherboard 260. Further, the side of the first heat dissipation branch 110 and the second heat-generating assembly 230 facing away from the radiator 170 may be in contact with each other through other structures.

An embodiment of the present disclosure further provides an electronic device control method. The electronic device control method corresponds to the embodiments of the electronic device described above, therefore, the description of relevant features in the electronic device described above is also applicable to the electronic device control method, and details will not be repeated here.

As shown in FIG. 16, the control method includes:
101, monitoring the heating parameters of the first heat-generating assembly 220 and/or the second heat-generating assembly 230 of the electronic device and/or the operating parameters of the electronic device.

102, determining the control parameters of the corresponding drive assembly 181 and/or the control valve based on the heating parameters and/or the operating parameters to control the flow rate of the heat dissipation medium in the first heat dissipation branch 110 and/or the second heat dissipation branch 120 based on the control parameters.

In some optional implementation of the embodiments of the present disclosure, determining the control parameters of the corresponding drive assembly 181 and/or control valve based on the heating parameters and/or the operating parameters may include determining the target heating area based on the heating parameters and/or the operating parameters, and determining the control parameters of the drive assembly 181 and/or the control valve corresponding to the target heating area.

In some optional implementation of the embodiments of the present disclosure, determining the control parameters of the corresponding drive assembly 181 and/or control valve based on the heating parameters and/or the operating parameters may include determining the target heating area based on the heating parameters and/or the operating parameters, and determining the control parameters of the drive assembly 181, the control valve, and/or the fan corresponding to the target heating area.

The above are some embodiments of the present disclosure, and are not intended to limit the scope of the present disclosure. Any equivalent structural transformation made by using the description and drawings of the present disclosure or made by directly or indirectly using the present disclosure in other related technical fields are included in the scope of the present disclosure.

What is claimed is:

1. A water-cooled heat dissipation module comprising:
a first heat dissipation branch for guiding a heat dissipation medium to flow in a first space;

a second heat dissipation branch communicating with the first heat dissipation branch for guiding the heat dissipation medium to flow in a second space; and
a control assembly for controlling a flow rate of the heat dissipation medium in the first heat dissipation branch and/or the second heat dissipation branch, the control assembly comprising at least one control valve and/or at least one drive assembly disposed in the first heat dissipation branch and/or the second heat dissipation branch, wherein:
the first space and the second space are non-overlapping;
in a process in which the water-cooled heat dissipation module is configured to dissipate heat of an electronic device, the control assembly is configured to determine a plurality of control parameters of the at least one control valve and/or the at least one drive assembly based on a plurality of heating parameters of a first heat-generating assembly and/or a second heat-generating assembly of the electronic device and/or a plurality of operating parameters of the electronic device, and based on the determined plurality of control parameters, control the first heat dissipation branch to dissipate heat for at least a part of a first heat-generating assembly of the electronic device, and/or control the second heat dissipation branch to dissipate heat for at least a part of a second heat-generating assembly and/or the first heat-generating assembly of the electronic device.

2. The water-cooled heat dissipation module of claim 1 further comprising:
a box body for accommodating the heat dissipation medium, the first heat dissipation branch and the second heat dissipation branch being in communication through the box body, wherein:
the control assembly includes a drive assembly, the drive assembly being arranged in the second heat dissipation branch to drive the heat dissipation medium to flow at least in the second heat dissipation branch, or in the second heat dissipation branch and the first heat dissipation branch that communicate with each other; or
the control assembly includes at least two drive assemblies, the at least two drive assemblies being respectively disposed on the first heat dissipation branch and the second heat dissipation branch to drive the heat dissipation medium to flow at least in the first heat dissipation branch and/or the second heat dissipation branch.

3. The water-cooled heat dissipation module of claim 2, wherein the drive assembly includes:
a flow guide having a first receiving cavity and at least two sets of outlets and inlets, the at least two sets of outlets and inlets respectively communicating with the first heat dissipation branch and the second heat dissipation branch;
a drive device disposed in the first receiving cavity for driving the heat dissipation medium to flow in the first heat dissipation branch and/or the second heat dissipation branch based on the outlets and inlets; and
a sealing member for sealing the drive device into the first receiving cavity of the flow guide.

4. The water-cooled heat dissipation module of claim 1, wherein:
the second heat dissipation branch includes a first part of a heat dissipation pipe and a second part of the heat dissipation pipe arranged on a radiator, the first part of the heat dissipation pipe being used to dissipate heat for at least part of the second heat-generating assembly, the second part of the heat dissipation pipe and the first part of the heat dissipation pipe being connected in parallel, the second part of the heat dissipation pipe being used to dissipate heat for at least part of the first heat-generating assembly and at least part of the second heat-generating assembly independently or in combination with the first heat dissipation branch; or, the second heat dissipation branch includes the a first part of the heat dissipation pipe, a second part of the heat dissipation pipe, and a third part of the heat dissipation pipe, the first part of the heat dissipation pipe being used to dissipate heat for at least part of the second heat-generating assembly, the second part of the heat dissipation pipe being used to dissipate heat for at least part of the first heat-generating assembly and at least part of the second heat-generating assembly, the third part of the heat dissipation pipe being arranged in parallel or in series with the first heat dissipation branch to dissipate heat for at least part of the first heat-generating assembly.

5. The water-cooled heat dissipation module of claim 1, wherein the control assembly further includes:

the at least one control valve disposed in the first heat dissipation branch and/or the second heat dissipation branch to control the flow rate of the heat dissipation medium in the first heat dissipation branch and/or the second heat dissipation branch.

6. An electronic device comprising:

a first heat-generating assembly;

a second heat-generating assembly:

a water-cooled heat dissipation module, the water-cooled heat dissipation module including:

a first heat dissipation branch for guiding a heat dissipation medium to flow in a first space;

a second heat dissipation branch communicating with the first heat dissipation branch for guiding the heat dissipation medium to flow in a second space; and a control assembly for controlling a flow rate of the heat dissipation medium in the first heat dissipation branch and/or the second heat dissipation branch, the control assembly comprising at least one control valve and/or at least one drive assembly disposed in the first heat dissipation branch and/or the second heat dissipation branch;

a body having a second receiving cavity, the first heat dissipation branch, the second heat dissipation branch, the first heat-generating assembly, and the second heat-generating assembly being disposed in the second receiving cavity; and a monitor module for monitoring heating parameters of the first heat-generating assembly and/or the second heat-generating assembly and/or operating parameters of the electronic device, wherein:

the control assembly is configured to determine a plurality of control parameters of the at least one control valve and/or the at least one drive assembly based on a plurality of heating parameters of the first heat-generating assembly and/or the second heat-generating assembly of the electronic device and/or a plurality of operating parameters of the electronic device, and based on the determined plurality of control parameters, control the first heat dissipation branch to dissipate heat for at least part of the first heat-generating assembly based on the heating parameters and/or the operating parameters, and/or control the second heat dissipation branch to dissipate heat for at least part of the second heat-generating assembly and/or the first heat-generating assembly.

7. The electronic device of claim 6, the water-cooled heat dissipation module further comprising:

a box body for accommodating the heat dissipation medium, the first heat dissipation branch and the second heat dissipation branch being in communication through the box body, wherein:

the control assembly includes a drive assembly, the drive assembly being arranged in the second heat dissipation branch to drive the heat dissipation medium to flow at least in the second heat dissipation branch, or in the second heat dissipation branch and the first heat dissipation branch that communicate with each other; or the control assembly includes at least two drive assemblies, the at least two drive assemblies being respectively disposed on the first heat dissipation branch and the second heat dissipation branch to drive the heat dissipation medium to flow at least in the first heat dissipation branch and/or the second heat dissipation branch.

8. The electronic device of claim 7, wherein the drive assembly includes:

a flow guide having a first receiving cavity and at least two sets of outlets and inlets, the at least two sets of outlets and inlets respectively communicating with the first heat dissipation branch and the second heat dissipation branch;

a drive device disposed in the first receiving cavity for driving the heat dissipation medium to flow in the first heat dissipation branch and/or the second heat dissipation branch based on the outlets and inlets; and a sealing member for sealing the drive device into the first receiving cavity of the flow guide.

9. The electronic device of claim 6, wherein:

the second heat dissipation branch includes a first part of a heat dissipation pipe and a second part of the heat dissipation pipe arranged on a radiator, the first part of the heat dissipation pipe being used to dissipate heat for at least part of the second heat-generating assembly, the second part of the heat dissipation pipe and the first part of the heat dissipation pipe being connected in parallel, the second part of the heat dissipation pipe being used to dissipate heat for at least part of the first heat-generating assembly and at least part of the second heat-generating assembly independently or in combination with the first heat dissipation branch; or, the second heat dissipation branch includes the-a first part of the heat dissipation pipe, a second part of the heat dissipation pipe, and a third part of the heat dissipation pipe, the first part of the heat dissipation pipe being used to dissipate heat for at least part of the second heat-generating assembly, the second part of the heat dissipation pipe being used to dissipate heat for at least part of the first heat-generating assembly and at least part of the second heat-generating assembly, the third part of the heat dissipation pipe being arranged in parallel or in series with the first heat dissipation branch to dissipate heat for at least part of the first heat-generating assembly.

10. The electronic device of claim 6, wherein the control assembly further includes:

the at least one control valve disposed in the first heat dissipation branch and/or the second heat dissipation branch to control the flow rate of the heat dissipation medium in the first heat dissipation branch and/or the second heat dissipation branch.

11. The electronic device of claim 6, wherein:

a bottom wall of the body includes an air inlet, the air inlet corresponding to a first side surface of a radiator of the water-cooled heat dissipation module for air in outside environment to be introduced into a gap between heat dissipating pipes of the radiator from the air inlet;

the electronic device further includes:

a first set of fans disposed on the body, the first set of fans corresponding to a position of a first air outlet of a first side wall of the body, the first set of fans being configured to lead the air passing through the radiator from the first air outlet, the first side wall being arranged adjacent to the bottom wall; and a second set of fans disposed on the body, the second set of fans corresponding to a position of a second air outlet on a second side wall of the body, the second set of fans being configured to lead the air passing through the radiator from the second air outlet, the second side wall being opposite to the first side wall.

12. The electronic device of claim 11, wherein:

the second heat-generating assembly and the first heat-generating assembly are disposed on both sides of a motherboard, the radiator is disposed between the motherboard and the bottom wall of the body, and the first heat dissipation branch is disposed between the first heat-generating assembly and the second heat-generating assembly or on a side of the first heat-generating assembly facing away from the second heat-generating assembly; or the second heat-generating assembly and the first heat-generating assembly are disposed on a same side of a motherboard, the radiator is disposed on a plane between the motherboard and the first heat-generating assembly, and the first heat dissipation branch is disposed on a side of the first heat-generating assembly facing away from the radiator or is in contact with the side of the first heat-generating assembly and the second heat-generating assembly facing away from the radiator at the same time.

13. The electronic device of claim 6, wherein determining the plurality of control parameters of the at least one control valve and/or the at least one drive assembly based on the plurality of heating parameters of the first heat-generating assembly and/or the second heat-generating assembly of the electronic device and/or the plurality of operating parameters of the electronic device includes:

determining a target heating area based on the plurality of heating parameters and/or the plurality of operating parameters, and determining the plurality of control parameters of the at least one drive assembly and/or the at least one control valve corresponding to the target heating area; or determining the target heating area based on the plurality of heating parameters and/or the plurality of operating parameters, and determining a plurality of control parameters of a fan and the plurality of control parameters of the at least one drive assembly and/or the at least one control valve corresponding to the target heating area.

\* \* \* \* \*